US012631681B2

(12) United States Patent
Trieu et al.

(10) Patent No.: US 12,631,681 B2
(45) Date of Patent: May 19, 2026

(54) MODULAR AND ADJUSTABLE THERMAL LOAD TEST VEHICLE

(71) Applicant: Microsoft Technology Licensing, LLC, Redmond, WA (US)

(72) Inventors: Dennis Trieu, Calgary (CA); Bharath Ramakrishnan, Bellevue, WA (US); Husam Atallah Alissa, Redmond, WA (US); Robert Jason Lankston, II, Woodinville, WA (US); Xudong Tang, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 664 days.

(21) Appl. No.: 17/530,035

(22) Filed: Nov. 18, 2021

(65) Prior Publication Data

US 2023/0152369 A1      May 18, 2023

(51) Int. Cl.
G01R 31/28 (2006.01)

(52) U.S. Cl.
CPC ..... G01R 31/2875 (2013.01); G01R 31/2867 (2013.01); G01R 31/2877 (2013.01)

(58) Field of Classification Search
None
See application file for complete search history.

(56) References Cited

U.S. PATENT DOCUMENTS

2006/0263912 A1* 11/2006 Arroyo .................. G01K 7/425
374/10
2008/0243461 A1* 10/2008 Li ........................... G06F 30/23
703/13

2013/0249579 A1* 9/2013 Lin ..................... G01R 31/2875
324/750.13
2014/0020405 A1* 1/2014 Kruglick ................. F25B 21/04
62/3.2
2016/0061884 A1* 3/2016 Cho .................... G01R 31/2875
324/750.13

(Continued)

OTHER PUBLICATIONS

Ramakrishnan, et al., "Experimental Characterization of Cold Plates used in Cooling Multi Chip Server Modules (MCM)", In Proceedings of 17th IEEE Intersociety Conference on Thermal and Thermomechanical Phenomena in Electronic Systems, May 29, 2018, 9 Pages.

(Continued)

*Primary Examiner* — Erica S Lin
(74) *Attorney, Agent, or Firm* — Ray Quinney & Nebeker P.C.; John O. Carpenter

(57) ABSTRACT

Devices for simulating thermal loads may include a platform, a stage affixed to the platform but having a portion that is moveable relative to the platform, and nodes coupled with the platform. In one example, a node may be affixed to the movable portion of the stage so as to be movable relative to the platform. In another example, a thermal node may be affixed to the movable portion of the stage and provide a thermal flux at a top surface of the thermal node. In another example, the stage may include a first substage that is affixed to the platform and a second substage that is moveable relative to the first substage. A node may be affixed to the second substage so as to be moveable relative to the first substage. Thermal energy may be transferred between the thermal source and a top surface of the node.

20 Claims, 5 Drawing Sheets

(56) References Cited

U.S. PATENT DOCUMENTS

| 2020/0160932 | A1* | 5/2020 | Motika | G11C 29/56 |
| 2022/0128597 | A1* | 4/2022 | McKenna | G01R 31/2863 |
| 2023/0343605 | A1* | 10/2023 | Zhang | H01L 23/3185 |

OTHER PUBLICATIONS

"International Search Report and Written Opinion Issued in PCT Application No. PCT/US22/042406", Mailed Date: Jan. 2, 2023, 10 Pages.

Polzer, et al., "High performance computing (HPC) 3 dimensional integrated (3DI) thermal test vehicle validation effort", In Proceedings of 31st Thermal Measurement, Modeling & Management Symposium IEEE, Mar. 13, 2017, pp. 213-220.

Terraneo, et al., "An Open-Hardware Platform for MPSoC Thermal Modeling", In Proceedings of 19th International Conference, Embedded Computer Systems: Architectures, Modeling, and Simulation, Aug. 8, 2019, pp. 184-196.

Thomas, et al., "Application of Thermal Test Chips to Stacked Chip Packages", In Proceedings of 29th Annual IEEE Semiconductor Thermal Measurement and Management Symposium, Mar. 17, 2013, pp. 13-22.

Office Action Received for Taiwan Application No. 111138189, mailed on Jan. 23, 2026, 15 Pages. (English Translation Provided).

* cited by examiner

524

518

Memory Interface

System Agent

CPU Core

CPU Core

CPU Core

Ring Interconnect

CPU Core

CPU Core

CPU Core

GPU + Media Capabilities *522*

526

520

514

528

504

MODULAR AND ADJUSTABLE THERMAL LOAD TEST VEHICLE

BACKGROUND

Background and Relevant Art

Bespoke, high-density computing devices used for compute-heavy workloads (gaming, machine learning, etc.) include multiple processing devices or communication devices on a single chip. For example, a multi-chip module (MCM) can include a plurality of central processing unit cores, one or more graphical processing unit cores, memory pathways, other application specific integrated circuits, or combinations thereof. The components of the chip or MCM may produce different thermal flux and have different geometries, presenting challenges in designing thermal management systems to cool the chip or MCM.

BRIEF SUMMARY

In some embodiments, a device for simulating thermal loads includes a platform and a plurality of nodes supported by the platform. At least one node is a movable node connected to the platform by a movable stage to move the movable node relative to the platform.

In some embodiments, a device for simulating thermal loads includes a platform and a plurality of thermal nodes supported by the platform, at least one node of the plurality of thermal nodes. At least one of the thermal nodes is a configured to provide a thermal flux at a top surface.

In some embodiments, a device for simulating thermal loads includes a platform, a movable stage, a node, and a thermal source. The movable stage includes a first substage and a second substage. The first substage is movable relative to the second substage, and the second substage is coupled to the platform. The node is coupled to the first substage. The thermal source is connected to the node to transfer thermal energy between the thermal source and a top surface of the node.

This Summary is provided to introduce a selection of concepts in a simplified form that are further described below in the Detailed Description. This Summary is not intended to identify key features or essential features of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 5-1 is a plan view of a multi-chip module;

FIG. 5-2 is a perspective view of a TTV simulating the MCM of FIG. 5-1, according to the present disclosure;

DETAILED DESCRIPTION

The present disclosure relates generally to systems and methods for testing thermal management devices for chips and chip modules. More particularly, the present disclosure relates to systems and methods for simulating a chip or multi-chip module (MCM) design with a high degree of precision to allow engineers to test one or more thermal management solutions to control the thermal performance of the chip or MCM design. While allowing an engineer to test the chip or MCM design, a thermal test vehicle (TTV) according to the present disclosure may also include movable stages to precisely move the simulated chips or chip components to modify the chip or MCM design to evaluate how changes to the chip or MCM design affect the thermal profile or thermal performance of the simulated chip or MCM.

A plurality of movable nodes can be used to simulate the size, shape, position, thermal flux, and other properties of the components of a chip or MCM design. The components of the chip or MCM design may include a plurality of central processing unit (CPU) cores, one or more graphical processing unit (GPU) cores, memory pathways, other application specific integrated circuits (ASICs), or combinations thereof (hereinafter "chiplets").

Figure 1:
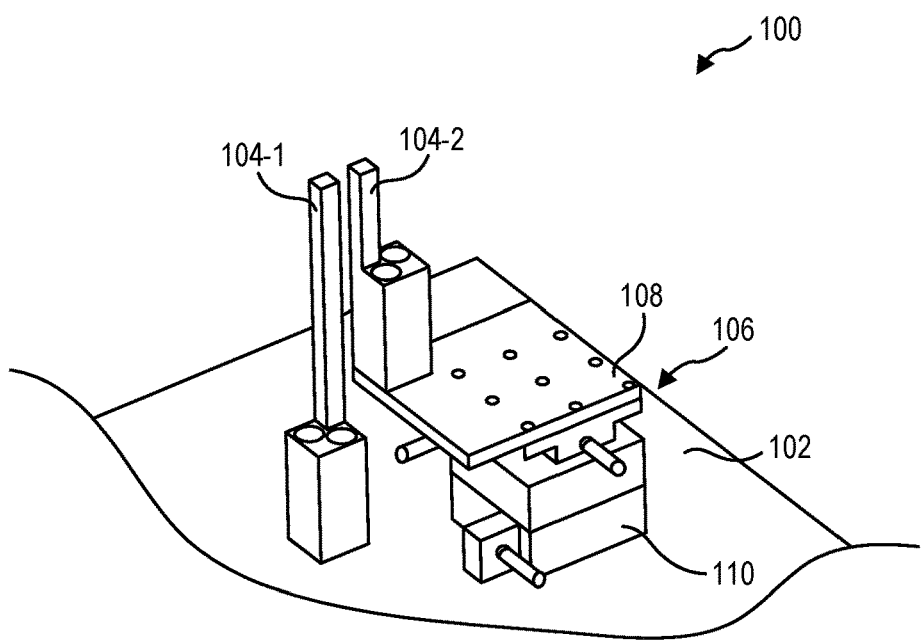
FIG. 1 is a perspective view of a thermal test vehicle (TTV), according to the present disclosure.

In some embodiments, a TTV according to the present disclosure includes a platform upon which at least one node is supported. FIG. 1 illustrates a TTV 100 with a platform 102 that is a substantially flat surface upon which the nodes 104-1, 104-2 are positioned and supported to simulate the chiplets in the chip or MCM design. In some embodiments, the platform 102 is flat in at least one direction to within 100 microns. In some embodiments, the platform 102 is planar in two directions to within 100 microns. In some embodiments, the platform 102 is planar to within 30 microns. In at least one embodiment, the platform 102 is planar to within the positional precision of at least one movable stage 106 supporting a node 104-2.

A node 104-1 may be directly coupled to the platform 102, or a node 104-2 may be connected to the platform 102 by a movable stage 106 positioned therebetween. The node 104-2 may be coupled to a surface 108 of the movable stage 106, and a base 110 of the movable stage 106 may be coupled to the platform 102 to allow precise movement of the node 104-2 relative to the platform 102.

The nodes 104-1, 104-2 and/or stages 106 may be coupled to the platform 102 through one or more connection mechanisms. For example, a platform 102 may include a plurality of holes that allow the nodes 104-1, 104-2 and/or stages 106 to be affixed to the platform 102. In at least one example, a grid of holes may allow a movable stage 106 to be positioned at discrete, reproducible locations and orientations to recreate chip or MCM geometries. The holes may be threaded or unthreaded. In other examples, the platform 102 may include one or more slots, such as t-slots, to allow continuous movement and adjustment along known directions of the platform. In yet other examples, a grid of magnets in the platform 102 may apply an attractive and/or repulsive magnetic force to a node 104-1, 104-2 and/or stage 106 to retain and/or align the node 104-1, 104-2 and/or stage 106 on the platform 102.

The nodes 104-1, 104-2 may be made of or include any thermally conductive material. In some embodiments, the nodes are made of or include copper, aluminum, iron, and other thermally conductive metals and alloys thereof. In some embodiments, the nodes include an electrically resistive material that allows the node to heat in response to an applied electrical current, thereby providing the thermal energy from the node itself.

Figure 2:
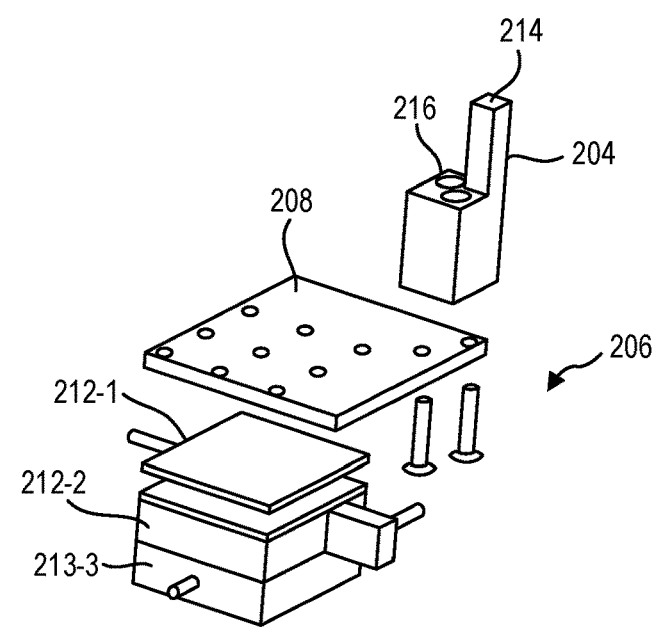
FIG. 2 is a perspective view of a node and movable stage, according to the present disclosure.

The node may be coupled to the platform directly. In other examples, the node may be coupled to a stage that is coupled to the platform. Referring now to FIG. 2, the stage 206 may be a movable stage that allows precise adjustment of the position and/or orientation of the node 204 relative to the platform. A node 204 coupled to a movable stage 206 allows the movable node 204 to be positioned with a precision of less than 100 microns. For example, the movable stage 206 may have discrete positions with displacements less than 100 microns. In other examples, the movable stage 206 allows continual movements with less than 100 microns of backlash or free movement of the stage 206 and/or node 204 when positioned. In at least one example, the movable stage 206 has a precision of less than 30 microns.

In some embodiments, the stage provides movement in at least one axis, such as the z-direction normal to the surface of the platform. In some embodiments, the stage provides movement in at least three axes. For example, the stage may provide movement in the x-, y-, and z-directions relative to the surface of the platform. FIG. 2 illustrates a movable stage 206 with three directional substages 212-1, 212-2, 212-3 that each provide movement in at least one direction. The node 204 is connected to a surface 208, which is in turn connected to the first substage 212-1. The first substage 212-1 provides movement in the z-direction. The first substage 212-1 is connected to the second substage 212-2. The second substage 212-2 provides movement in the y-direction. The second substage 212-2 is connected to the third substage 212-3. The third substage 212-3 provides movement in the x-direction. In other embodiments, the stage 206 may provide movement in more than three axes, such as translation in the x-, y-, and z-axes and rotation around the x-, y-, and z-axes.

The stage 206 may retain the selected position to within the precision tolerance as described herein (100 microns, 30 microns, etc.) when a force is applied to the stage. For example, the movable stage 206 may retain the selected position when a force of up to 100 Newtons (N) is applied to the stage. In some embodiments, a thermal interface material, such as a thermal paste, is applied to a top surface 214 of the node 204 when a thermal management device is connected to the node 204. When the thermal management device, such as a cold plate or vapor chamber is positioned on the thermal interface material, a compressive force may be applied to compress the thermal interface material between the top surface 214 of the node 204 and the thermal management device to ensure a complete contact. The stage 206 may be stable to within the positional tolerance up to 100 N to prevent movement of the node 204 when the thermal management device is positioned.

As described herein, the node 204 may include a thermally conductive material to conduct heat between the top surface 214 of the node 204 and a thermal source. In some embodiments, the node 204 is a thermal node and includes the thermal source. For example, the node 204 may be or include a resistive heater. Applying an electric current to the resistive heater heats the thermal node 204. A thermocouple positioned on the thermal node 204 at or near the top surface 214 allows a user to control the temperature of the top surface 214 by increasing or decreasing the applied current.

In other examples, the node 204 may be connected to a thermal source to control the temperature of the top surface 214 of the node 204. In some embodiments, a thermal source is positioned in a recess or pocket 216 of the node 204 to apply or remove heat from the node 204. In some examples, the thermal source is an insertable cartridge that includes a resistive heater. In some examples, the thermal source is a heated or cooled fluid that flows through a port in the node 204 to heat or cool the node material. In at least one embodiment, the thermal source is the stage 206, which heats or cools the node 204 through a base of the node 204 coupled to the stage 206.

Figure 3:
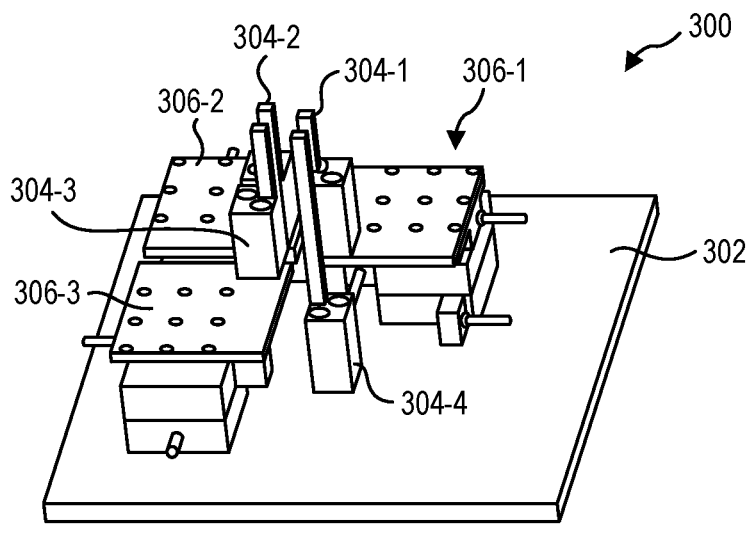
FIG. 3 is a perspective view of a TTV with movable and fixed nodes, according to the present disclosure.

FIG. 3 illustrates an embodiment of a TTV 300 with a combination of nodes 304-1, 304-2, 304-3, 304-4 and stages 306-1, 306-2, 306-3. In some embodiments, a TTV 300 according to the present disclosure includes a mix of node types and connections to the platform 302. For example, a TTV 300 may include at least one node 304-4 coupled directly to the platform 302 and at least one node 304-1 coupled to a movable stage 304-1. The movable node 304-1 is therefore adjustable relative to the fixed node 304-4 coupled directly to the platform 302. In some embodiments, the TTV 300 includes at least one thermal node 304-2 to simulate a heat-generating component of a chip or MCM design and at least one node 304-3 that does not have a thermal source connected thereto.

Figure 4:
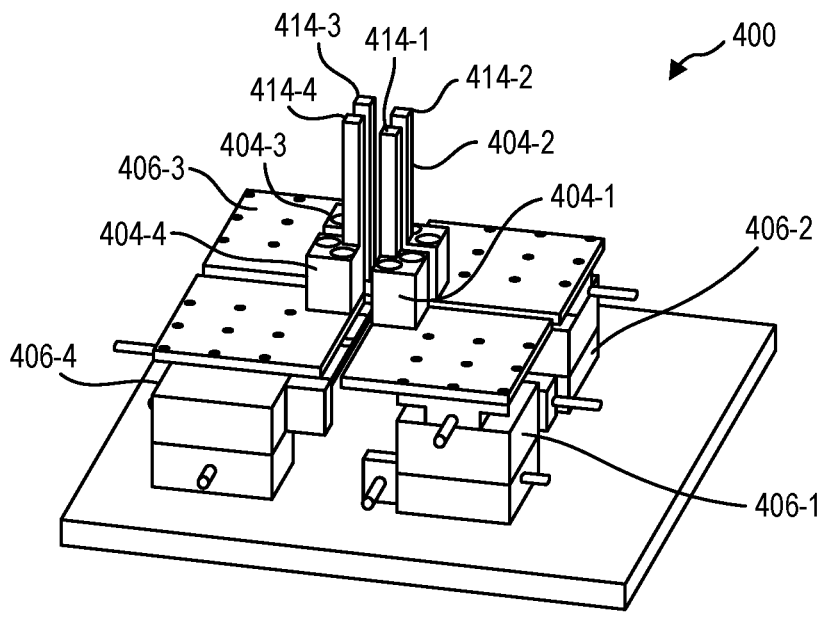
FIG. 4 is a perspective view of a TTV with a plurality of movable nodes, according to the present disclosure.

In a particular example shown in FIG. 4, a TTV 400 may include at least four thermal nodes 404-1, 404-2, 404-3, 404-4 that allow the TTV 400 to simulate a MCM. As described herein, the thermal nodes 404-1, 404-2, 404-3, 404-4 may be movable via movable stages 406-1, 406-2, 406-3, 406-4 that allow the nodes 404-1, 404-2, 404-3, 404-4 to be precisely positioned relative to one another in at least one axis and simulate the topography and thermal load of chiplets of a MCM. For example, each node 404-1, 404-2, 404-3, 404-4 may be set such that each top surface 414-1, 414-2, 414-3, 414-4 is at a different temperature to simulate the heat generation of different processing cores or other computing components of the MCM.

In some embodiments, a node 404-1, 404-2, 404-3, 404-4 has a square or rectangular top surface 414-1, 414-2, 414-3, 414-4 to simulate the surface of a conventional processing core. In other embodiments, a node has a non-rectangular top surface that may allow for the simulate or other chiplets or portions of chiplets in non-conventional chip designs. For example, a node may have an octagonal top surface to simulate an octagonal processing core. In other examples, the top surface of the node may be triangular, trapezoidal, pentagonal, hexagonal, or other regular polygonal or irregular polygonal shapes, and may have one or more curved edge, such as at least a portion of a circle, an oval, or other curved shape. In at least one example, the top surface of the node is non-planar to simulate a convex or concave chiplet surface.

Figures 1, 5:
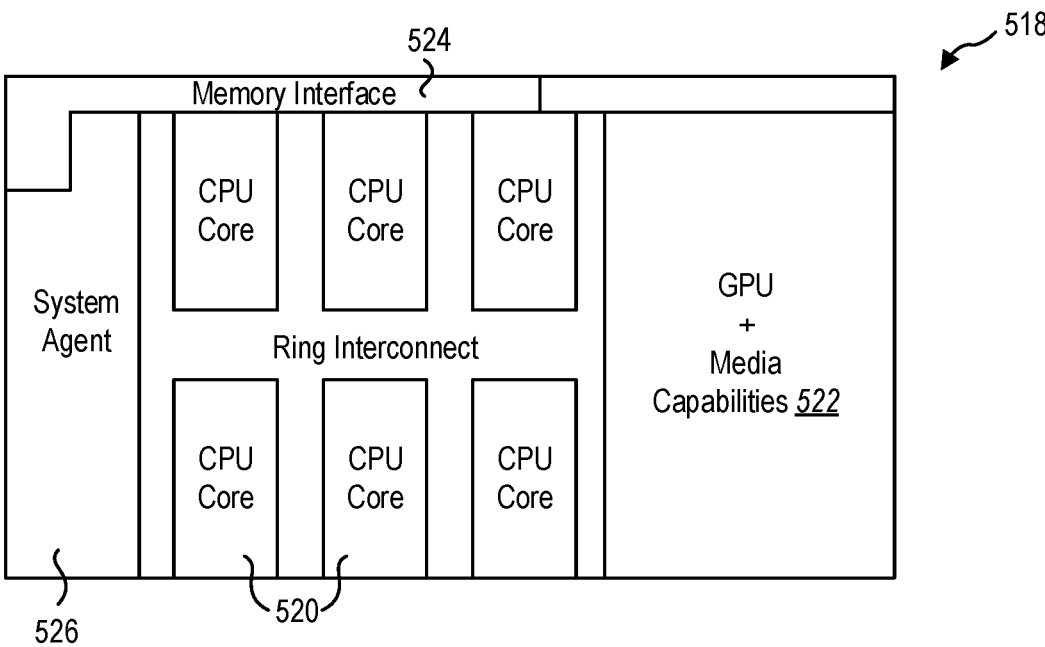
Figures 2, 5:
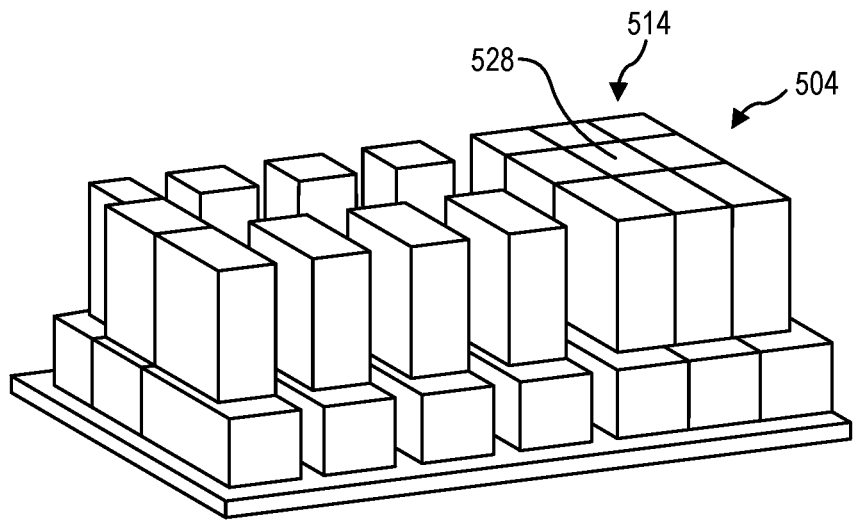

A plurality of nodes may be positioned adjacent to one another to simulate a single chiplet or processing core. FIG. 5-1 is a plan view of an example of a MCM 518. For example, some chiplets or processing cores 520 have a conventional rectilinear shape that is simulated through a single node with a rectangular top surface. Other chiplets or processing cores 520 have a non-rectilinear shape or have an area larger than a single node can simulate. For example, a GPU 522 may be larger than the plurality of processing cores 520 of the CPU. A control processor, memory interface 524, or system agent 526 may have a different shape from the processing cores 520. A plurality of nodes may combine to simulate the shape or size of a single chiplet or processing core 520. In some embodiments, a first chiplet is simulated by a first node, while a second chiplet is simulated by a plurality of nodes with top surfaces positioned near or adjacent to one another.

Referring now to FIG. 5-2, a TTV 500 simulates the design and topography of the MCM 518 of FIG. 5-1. In some embodiments, a plurality of nodes 504 may be positioned with top surfaces 514 positioned near or adjacent to one another to simulate a thermal gradient within a single chiplet or processing core. For example, a GPU (such as the GPU 522 of FIG. 5-1) may have a thermal gradient across a surface thereof during operation. The center of the GPU may operate at a higher temperature than the remainder of the GPU surface area. A plurality of nodes 504 can simulate the thermal gradient within the GPU by allowing a center node 528 at or near the center of the plurality of nodes 504 to be set to a higher temperature than other nodes 504 with top surfaces 514 near and/or adjacent to the center node 528. The resulting different in temperatures of the top surfaces 514 of the nodes 504 can help simulate the thermal gradient in the GPU during operation to better test thermal management devices.

Figure 6:
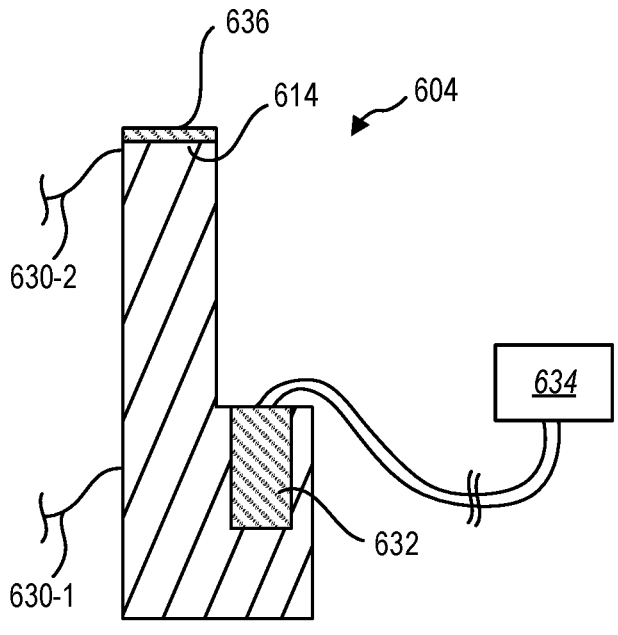
FIG. 6 is a cross-sectional side view of a thermal node, according to at least some embodiments of the present disclosure.

Heating a node can be done in one or more ways. FIG. 6 is a cross-sectional side view of an embodiment of a node 604. In a first example, a thermal cartridge 632 is inserted into a pocket 612 or recess in the node 604. A power source is connected to the thermal cartridge 632 to apply a current to the thermal cartridge 632 and heat the thermal cartridge. The heat from the thermal cartridge is conducted through the material of the node toward a top surface of the node.

In some embodiments, the node 604 has one or more thermocouples 630-1, 630-2 affixed thereto, and the thermocouples 630-1, 630-2 may inform the power applied to the thermal cartridge 632. For example, a high current may be applied to the thermal cartridge 632 until a first thermocouple 630-1 near the thermal cartridge 632 approaches a target temperature. The current may be reduced once the first thermocouple 630-1 near the thermal cartridge 632 approaches a target temperature and while a second thermocouple 630-2 near the top surface 614 measures the temperature of the node 604 near the top surface 614. When the second thermocouple 630-2 near the top surface 614 approaches the target temperature, the power applied to the thermal cartridge 632 may be further reduced or stopped, allowing the heat from body of the node 604 to hold the top surface 614 and/or thermal interface material 636 at or near the target temperature.

In addition to the nominal temperature, the thermocouples 630-1, 630-2 can aid in measuring the thermal flux of the top surface 614 by determining how much thermal energy is in the node 604 at various positions relative to how much thermal energy is introduced to the node 604. For example, a measurement made at the thermal cartridge 632 and a measurement made at the top surface 614 can allow the heat flux through the node 604 and, hence, at the top surface 614, because the thermal conductivity of the node material is known and the distance between the thermal cartridge 632 and the top surface 614 is known.

Figure 7:
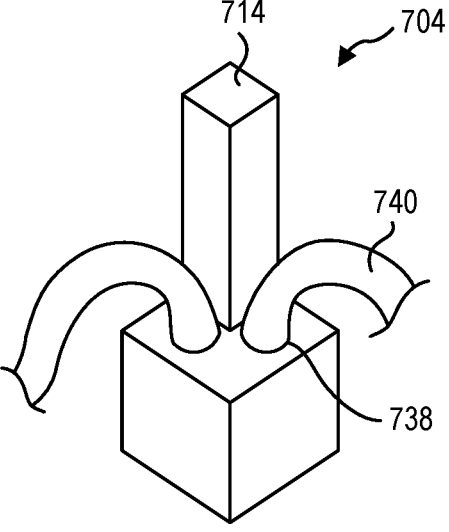
FIG. 7 is a perspective view of a fluid-thermally controlled thermal node, according to at least some embodiments of the present disclosure.

FIG. 7 is a perspective view of a liquid-thermally controlled node 704. While various forms of resistive heating have been described herein, other embodiments of nodes may be heated and/or cooled by a thermal fluid 740 flowed through a chamber 738 or port in the node 704. In some embodiments, the flow rate and/or temperature of the thermal fluid 740 may be adjusted to heat and/or cool the node 704 to the target temperature. For example, during testing, the TTV may perform repeated runs simulating a MCM increasing in temperature under a computational load. The thermal fluid 740 may be hotter than the node 704 to increase the temperature of the node material and approach a target temperature at a top surface 714. After the first run, a cold thermal fluid 740 may be flowed through the port and/or chamber 738 of the node 704 to cool the node 704 to a lower temperature, such as room temperature, below room temperature, or an elevated temperature above room temperature that is below the target operating temperature of the GPU being simulated. In at least one embodiment, both thermal fluids 740 and resistive heating may be used in combination. In at least one example, a resistive heater thermal cartridge may heat the node 704, and a cool thermal fluid 740 may cool the node 704.

Figure 8:
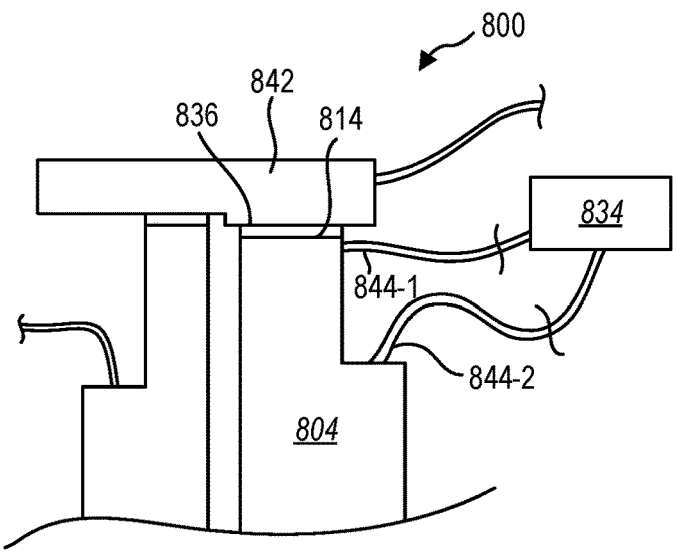
FIG. 8 is a side view of a TTV with a thermal management device positioned thereon, according to at least some embodiments of the present disclosure.

FIG. 8 is a side view of an embodiment of a TTV 800 with a thermal management device 842 coupled thereto. In at least one example, a node 804 is a thermal node that uses integral resistance heating, such as applying an electric current through a copper alloy that causes the body of the thermal node 804 to heat. In some embodiments, a first contact 844-1 of the power source 832 is positioned at or near the top surface 814 and a second contact 844-2 is positioned at or near a base of the thermal node 804. A thermal node 804 with a contact of the power source 834 at or near the top surface 814 may ensure the portion of the thermal node proximate the top surface 814 heats efficiently during application of current through the contacts.

A thermal interface material 836 is positioned between the top surface 814 of the node 804 and a thermal management device 842. In some embodiments, the thermal management device 842 includes a cold plate. In some embodiments, the thermal management device 842 includes a vapor chamber. In some embodiments, the thermal management device 842 includes a Peltier cooler. In some embodiments, the thermal management device 842 includes a heat spreader. In some embodiments, the thermal management device 842 includes a heat pip. The thermal management device 842 may have a surface that is at least partially complementary to the topography of the top surfaces 814 of the plurality of nodes 804. By accurately and precisely simulating the topography and thermal gradients of a new chip or MCM design, the thermal management device 842 can be tested and refined before the fabrication processes of the new chip or MCM design are complete.

Figure 9:
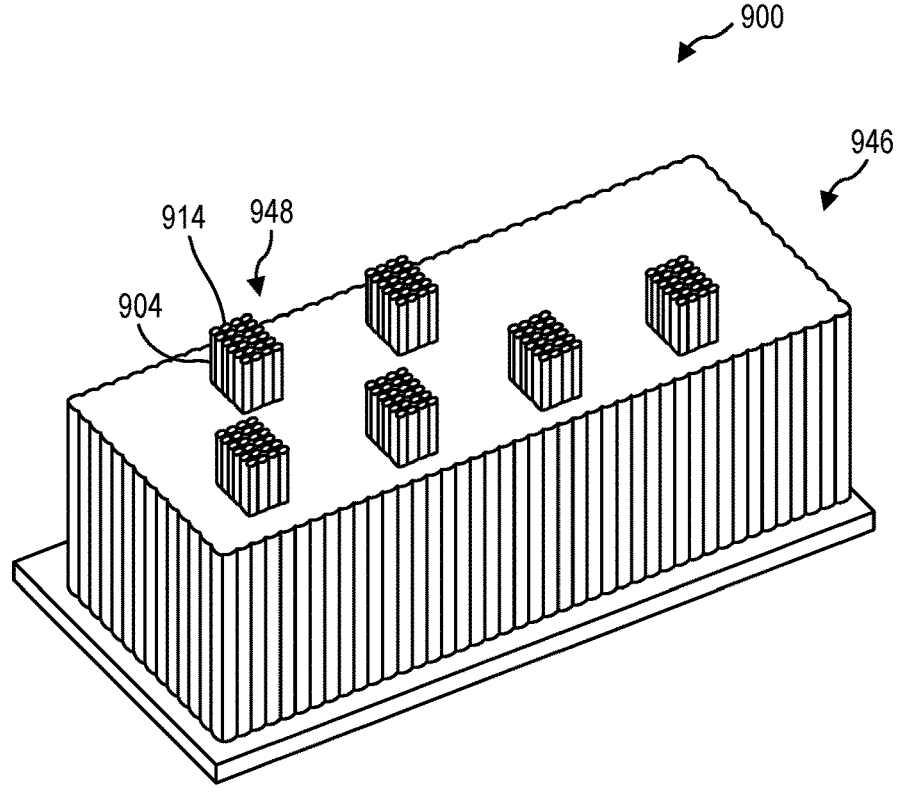
FIG. 9 is a perspective view of a high-density array of thermal nodes, according to at least some embodiments of the present disclosure.

Referring now to FIG. 9, while interchangeable and/or modular nodes are described herein, and the interchangeable and/or modular nodes may be selectively coupled to the platform and/or movable stages, still further MCM designs can be simulated using a TTV 900 with a high-density array 946 of small nodes 904. For example, a plurality of pin-like nodes 904 (cylindrical, square, or other cross-sectional shapes) in a closely packed array 946 may allow for rapid construction of simulated topographies by selectively actuating or raising nodes 904. For example, the surface area of a top surface 914 may be less than 4 mm$^2$. In other examples, the surface area of a top surface 914 may be less than 2 mm$^2$. In yet other examples, the surface area of a top surface 914 may be less than 1 mm$^2$. By selectively raising some nodes 904 in the high-density array 946, a cluster 948 of 100 nodes can simulate a 1 cm$^2$ processing core.

In some embodiments, each of the nodes 904 is raised independently of the surrounding nodes 904, allowing each to be raised by a different amount. The cluster of nodes may simulate a non-planar surface of a chiplet or processing core, such as a convex or concave surface. In a particular example, a cluster of 100 nodes can simulate an convex oval 1 cm$^2$ processing core. In at least another example, a cluster of 200 nodes can simulate a semicircular processing core with each node set to a different target temperature to simulate a thermal gradient across the processing core. In some embodiments, the nodes of the high-density array are actuated (e.g., raised) by an electromagnet. In other embodiments, nodes of the high-density array are actuated hydraulically, mechanically, or by positioned a solid block underneath the array to force the nodes upward. A high-density array can allow for the simulation of unconventional chiplet shapes and designs while also allowing rapid recreation of many different MCM designs.

In at least one embodiment, a TTV according to the present disclosure allows for the shapes, sizes, positions, temperatures, and thermal fluxes of the components of a chip or MCM to be replicated. Thermal management devices can be developed, tested, and refined without first developing the expensive and complex fabrication of the proposed chip or MCM.

INDUSTRIAL APPLICABILITY

The present disclosure relates generally to systems and methods for testing thermal management devices for chips and chip modules. More particularly, the present disclosure relates to systems and methods for simulating a chip or multi-chip module (MCM) design with a high degree of precision to allow engineers to test one or more thermal management solutions to control the thermal performance of the chip or MCM design. While allowing an engineer to test the chip or MCM design, a thermal test vehicle (TTV) according to the present disclosure may also include movable stages to precisely move the simulated chips or chip components to modify the chip or MCM design to evaluate how changes to the chip or MCM design affect the thermal profile or thermal performance of the simulated chip or MCM.

A plurality of movable nodes can be used to simulate the size, shape, position, thermal flux, and other properties of the components of a chip or MCM design. The components of the chip or MCM design may include a plurality of central processing unit (CPU) cores, one or more graphical processing unit (GPU) cores, memory pathways, other application specific integrated circuits (ASICs), or combinations thereof (hereinafter "chiplets").

In some embodiments, a TTV according to the present disclosure includes a platform upon which at least one node is supported. The platform is a substantially flat surface upon which the nodes are positioned and supported to simulate the chiplets in the chip or MCM design. In some embodiments, the platform is flat in at least one direction to within 100 microns. In some embodiments, the platform is planar in two directions to within 100 microns. In some embodiments, the platform is planar to within 30 microns. In at least one embodiment, the platform is planar to within the positional precision of at least one movable stage supporting a node.

A node may be directly coupled to the platform, or a node may be connected to the platform by a movable stage positioned therebetween. The node may be coupled to a surface of the movable stage, and a base of the movable stage may be coupled to the platform to allow precise movement of the node relative to the platform.

The nodes and/or stages may be coupled to the platform through one or more connection mechanisms. For example, a platform may include a plurality of holes that allow the nodes and/or stages to be affixed to the platform. In at least one example, a grid of holes may allow a movable stage to be positioned at discrete, reproducible locations and orientations to recreate chip or MCM geometries. The holes may be threaded or unthreaded. In other examples, the platform may include one or more slots, such as t-slots, to allow continuous movement and adjustment along known directions of the platform. In yet other examples, a grid of magnets in the platform may apply an attractive and/or repulsive magnetic force to a node or stage to retain and/or align the node or stage on the platform.

The nodes may be made of or include any thermally conductive material. IN some embodiments, the nodes are made of or include copper, aluminum, iron, and other thermally conductive metals and alloys thereof. In some embodiments, the nodes include an electrically resistive material that allows the node to heat in response to an applied electrical current, thereby providing the thermal energy from the node itself.

The node may be coupled to the platform directly. In other examples, the node may be coupled to a stage that is coupled to the platform. The stage may be a movable stage that allows precise adjustment of the position and/or orientation of the node relative to the platform. A node coupled to a movable stage allows the movable node to be positioned with a precision of less than 100 microns. For example, the movable stage may have discrete positions with displacements less than 100 microns. In other examples, the movable stage allows continual movements with less than 100 microns of backlash or free movement of the stage and/or node when positioned. In at least one example, the movable stage has a precision of less than 30 microns.

In some embodiments, the stage provides movement in at least one axis, such as the z-direction normal to the surface of the platform. In some embodiments, the stage provides movement in at least three axes. For example, the stage may provide movement in the x-, y-, and z-directions relative to the surface of the platform. In other embodiments, the stage may provide movement in more than three axes, such as translation in the x-, y-, and z-axes and rotation around the x-, y-, and z-axes.

The stage may retain the selected position to within the precision tolerance as described herein (100 microns, 30 microns, etc.) when a force is applied to the stage. For example, the movable stage may retain the selected position when a force of up to 100 Newtons (N) is applied to the stage. In some embodiments, a thermal interface material, such as a thermal paste, is applied to a top surface of the node when a thermal management device is connected to the node. When the thermal management device, such as a cold plate or vapor chamber is positioned on the thermal interface material, a compressive force may be applied to compress the thermal interface material between the top surface of the node and the thermal management device to ensure a complete contact. The stage may be stable to within the positional tolerance up to 100 N to prevent movement of the node when the thermal management device is positioned.

As described herein, the node may include a thermally conductive material to conduct heat between the top surface of the node and a thermal source. In some embodiments, the node is a thermal node and includes the thermal source. For example, the node may be or include a resistive heater. Applying an electric current to the resistive heater heats the thermal node. A thermocouple positioned on the thermal node at or near the top surface allows a user to control the temperature of the top surface by increasing or decreasing the applied current.

In other examples, the node may be connected to a thermal source to control the temperature of the top surface of the node. In some embodiments, a thermal source is positioned in a recess or pocket of the node to apply or remove heat from the node. In some examples, the thermal source is an insertable cartridge that includes a resistive heater. In some examples, the thermal source is a heated or cooled fluid that flows through a port in the node to heat or cool the node material. In at least one embodiment, the thermal source is the stage, which heats or cools the node through a base of the node coupled to the stage.

In some embodiments, a TTV according to the present disclosure includes a mix of node types and connections to the platform. For example, a TTV may include at least one node coupled directly to the platform and at least one node coupled to a movable stage. The movable node is therefore adjustable relative to the fixed node coupled directly to the platform. In some embodiments, the TTV includes at least one thermal node to simulate a heat-generating component of a chip or MCM design and at least one node that does not have a thermal source connected thereto.

In a particular example, a TTV may include at least four thermal nodes that allow the TTV to simulate a MCM. As described herein, the thermal nodes may be movable via movable stages that allow the nodes to be precisely positioned relative to one another in at least one axis and simulate the topography and thermal load of chiplets of an MCM. For example, each node may be set such that each top surface is at a different temperature to simulate the heat generation of different processing cores or other computing components of the MCM.

In some embodiments, a node has a square or rectangular top surface to simulate the surface of a conventional processing core. In other embodiments, a node has a non-rectangular surface that may allow for the simulate or other chiplets or portions of chiplets in non-conventional chip designs. For example, a node may have an octagonal top surface to simulate an octagonal processing core. In other examples, the top surface of the node may be triangular, trapezoidal, pentagonal, hexagonal, or other regular polygonal or irregular polygonal shapes, and may have one or more curved edge, such as at least a portion of a circle, an oval, or other curved shape. In at least one example, the top surface of the node is non-planar to simulate a convex or concave chiplet surface.

A plurality of nodes may be positioned adjacent to one another to simulate a single chiplet or processing core. For example, some chiplets or processing cores have a conventional rectilinear shape that is simulated through a single node with a rectangular top surface. Other chiplets or processing cores have a non-rectilinear shape or have an area larger than a single node can simulate. For example, a GPU may be larger than the plurality of processing cores of the CPU. A control processor, memory interface, or system agent may have a different shape from the processing cores. A plurality of nodes may combine to simulate the shape or size of a single chiplet or processing core. In some embodiments, a first chiplet is simulated by a first node, while a second chiplet is simulated by a plurality of nodes with top surfaces positioned near or adjacent to one another.

In some embodiments, a plurality of nodes may be positioned with top surfaces positioned near or adjacent to one another to simulate a thermal gradient within a single chiplet or processing core. For example, a GPU may have a thermal gradient across a surface thereof during operation. The center of the GPU may operate at a higher temperature than the remainder of the GPU surface area. A plurality of nodes can simulate the thermal gradient within the GPU by allowing a center node at or near the center of the plurality of nodes to be set to a higher temperature than other nodes with top surfaces near and/or adjacent to the center node. The resulting different in temperatures of the top surfaces of the nodes can help simulate the thermal gradient in the GPU during operation to better test thermal management devices.

Heating a node can be done in one or more ways. In a first example, a thermal cartridge is inserted into a pocket or recess in the node. A power source is connected to the thermal cartridge to apply a current to the thermal cartridge and heat the thermal cartridge. The heat from the thermal cartridge is conducted through the material of the node toward a top surface of the node.

In some embodiments, the node has one or more thermocouples affixed thereto, and the thermocouples may inform the power applied to the thermal cartridge. For example, a high current may be applied to the thermal cartridge until a first thermocouple near the thermal cartridge approaches a target temperature. The current may be reduced once the first thermocouple near the thermal cartridge approaches a target temperature and while a second thermocouple near the top surface measures the temperature of the node near the top surface. When the second thermocouple near the top surface approaches the target temperature, the power applied to the thermal cartridge may be further reduced or stopped, allowing the heat from body of the node to hold the top surface at or near the target temperature.

In addition to the nominal temperature, the thermocouples can aid in measuring the thermal flux of the top surface by determining how much thermal energy is in the node at various positions relative to how much thermal energy is introduced to the node. For example, a measurement made at the thermal cartridge and a measurement made at the top surface can allow the heat flux through the node and, hence, at the top surface, because the thermal conductivity of the node material is known and the distance between the thermal cartridge and the top surface is known.

While various forms of resistive heating have been described herein, other embodiments of nodes may be heated and/or cooled by a thermal fluid flowed through a chamber or port in the node. In some embodiments, the flow rate and/or temperature of the thermal fluid may be adjusted to heat and/or cool the node to the target temperature. For example, during testing, the TTV may perform repeated runs simulating a MCM increasing in temperature under a computational load. The thermal fluid may be hotter than the node to increase the temperature of the node material and approach a target temperature at a top surface. After the first run, a cold thermal fluid may be flowed through the port and/or chamber of the node to cool the node to a lower temperature, such as room temperature, below room temperature, or an elevated temperature above room temperature that is below the target operating temperature of the GPU being simulated. In at least one embodiment, both thermal fluids and resistive heating may be used in combination. In at least one example, a resistive heater thermal cartridge may heat the node, and a cool thermal fluid may cool the node.

In at least one example, the node is a thermal node that uses integral resistance heating, such as applying an electric current through a copper alloy that causes the body of the thermal node to heat. In some embodiments, a first contact of the power source is positioned at or near the top surface and a second contact is positioned at or near a base of the thermal node. A thermal node with a contact of the power source at or near the top surface may ensure the portion of the thermal node proximate the top surface heats efficiently during application of current through the contacts.

A thermal interface material is positioned between the top surface of the node and a thermal management device. In some embodiments, the thermal management device includes a cold plate. In some embodiments, the thermal management device includes a vapor chamber. In some embodiments, the thermal management device includes a Peltier cooler. In some embodiments, the thermal management device includes a heat spreader. In some embodiments, the thermal management device includes a heat pip. The thermal management device may have a surface that is at least partially complementary to the topography of the top surfaces of the plurality of nodes. By accurately and precisely simulating the topography and thermal gradients of a new chip or MCM design, the thermal management device can be tested and refined before the fabrication processes of the new chip or MCM design are complete.

While interchangeable and/or modular nodes are described herein, and the interchangeable and/or modular nodes may be selectively coupled to the platform and/or movable stages, still further MCM designs can be simulated using a high-density array of small nodes. For example, a plurality of pin-like nodes (cylindrical, square, or other cross-sectional shapes) in a closely packed array may allow for rapid construction of simulated topographies by selectively actuating or raising nodes. For example, the surface area of a top surface may be less than 4 $mm^2$. In other examples, the surface area of a top surface may be less than 2 $mm^2$. In yet other examples, the surface area of a top surface may be less than 1 $mm^2$. By selectively raising some nodes in the high-density array, a cluster of 100 nodes can simulate a 1 $cm^2$ processing core.

In some embodiments, each of the nodes is raised independently of the surrounding nodes, allowing each to be raised by a different amount. The cluster of nodes may simulate a non-planar surface of a chiplet or processing core, such as a convex or concave surface. In a particular example, a cluster of 100 nodes can simulate an convex oval 1 $cm^2$ processing core. In at least another example, a cluster of 200 nodes can simulate a semicircular processing core with each node set to a different target temperature to simulate a thermal gradient across the processing core. In some embodiments, the nodes of the high-density array are actuated (e.g., raised) by an electromagnet. In other embodiments, nodes of the high-density array are actuated hydraulically, mechanically, or by positioned a solid block underneath the array to force the nodes upward. A high-density array can allow for the simulation of unconventional chiplet shapes and designs while also allowing rapid recreation of many different MCM designs.

In at least one embodiment, a TTV according to the present disclosure allows for the shapes, sizes, positions, temperatures, and thermal fluxes of the components of a chip or MCM to be replicated. Thermal management devices can be developed, tested, and refined without first developing the expensive and complex fabrication of the proposed chip or MCM.

The present disclosure relates to systems and methods for testing thermal management devices according to at least the examples provided in the sections below:

[A1] In some embodiments, a device for simulating thermal loads includes a platform and a plurality of nodes supported by the platform. At least one node is a movable node connected to the platform by a movable stage to move the movable node relative to the platform.

[A2] In some embodiments, at least node of the plurality of nodes of [A1] is a thermal node. The thermal node is configured to provide thermal energy at a top surface of the thermal post.

[A3] In some embodiments, the thermal node of [A2] is connected to a thermal source and conducts thermal energy to or from the top surface.

[A4] In some embodiments, the thermal node of [A2] is a thermal source.

[A5] In some embodiments, the movable stage of any of [A1] through [A4] moves the movable node in a z-direction relative to the platform.

[A6] In some embodiments, the movable stage of any of [A1] through [A5] moves the movable node in at least three axes relative to the platform.

[A7] In some embodiments, the movable stage of any of [A1] through [A6] moves the movable node with a precision less than 100 microns relative to the platform.

[A8] In some embodiments, the plurality of nodes of any of [A1] through [A7] includes at least 4 nodes.

[A9] In some embodiments, the at least 4 nodes of [A8] are each movable nodes that are independently movable by at least 4 movable stages.

[A10] In some embodiments, a first movable node of the plurality of nodes of any of [A1] through [A9] is coupled to and movable relative to the platform by a first movable stage, and a second movable node of the plurality of nodes of any of [A1] through [A9] is coupled to and movable relative to the platform by a second movable stage.

[A11] In some embodiments, a first thermal node of the plurality of nodes of any of [A1] through [A10] is configured to provide a first thermal flux at a first top surface of the first thermal post, and a second thermal node of the plurality of nodes of any of [A1] through [A10] is configured to provide a second thermal flux at a second top surface of the second thermal post.

[A12] In some embodiments, the first thermal flux of [A11] is different from the second thermal flux.

[A13] In some embodiments, the first top surface of [A11] has a different area than the second top surface.

[A14] In some embodiments, the device of any of [A1] through [A13] includes a heat sink in contact with a top surface of at least two nodes of the plurality of nodes.

[A15] In some embodiments, the device of any of [A1] through [A13] a vapor chamber in contact with a top surface of at least two nodes of the plurality of nodes.

[B1] In some embodiments, a device for simulating thermal loads includes a platform and a plurality of thermal nodes supported by the platform, at least one node of the plurality of thermal nodes. At least one of the thermal nodes is a configured to provide a thermal flux at a top surface.

[B2] In some embodiments, a first top surface of a first thermal node of the plurality of thermal nodes of [B1] is adjacent to a second top surface of a second thermal node of the plurality of thermal nodes of [B1] and the first top surface and second top surface are configured to simulate at least a portion of a chiplet.

[B3] In some embodiments, a first thermal flux of the first thermal node of [B2] is different from the second thermal flux of the second thermal node.

[B4] In some embodiments, a surface area of at least two of the thermal nodes of the plurality of thermal nodes of [B2] have a top surface area of less than 4 mm$^2$.

[C1] In some embodiments, a device for simulating thermal loads includes a platform, a movable stage, a node, and a thermal source. The movable stage includes a first substage and a second substage. The first substage is movable relative to the second substage, and the second substage is coupled to the platform. The node is coupled to the first substage. The thermal source is connected to the node to transfer thermal energy between the thermal source and a top surface of the node.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the scope of the present disclosure, and that various changes, substitutions, and alterations may be made to embodiments disclosed herein without departing from the scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A device for simulating thermal loads, the device comprising:
   a platform;
   a stage affixed to the platform, a portion of the stage being moveable horizontally relative to the platform; and
   a plurality of nodes coupled with the platform, the plurality of nodes configured to simulate a size or shape of a component of a chip or multi-chip module design, wherein a node of the plurality of nodes is affixed to the moveable portion of the stage so as to be a movable node relative to the platform.

2. The device of claim 1, wherein at least one node of the plurality of nodes is a thermal node configured to provide thermal energy at a top surface of the thermal node.

3. The device of claim 2, wherein the thermal node is connected to a thermal source to conduct thermal energy to or from the top surface.

4. The device of claim 2, wherein the thermal node is a thermal source.

5. The device of claim 1, wherein the movable node is movable by the moveable portion of the stage in a z-direction relative to the platform.

6. The device of claim 1, wherein the movable node is movable by the moveable portion of the stage in at least three axes relative to the platform.

7. The device of claim 1, wherein the movable node is movable by the moveable portion of the stage with a precision of less than 100 microns relative to the platform.

8. The device of claim 1, wherein the plurality of nodes includes at least three nodes in addition to the movable node.

9. The device of claim 8, further comprising three stages affixed to the platform, a portion of each stage being moveable relative to the platform, wherein the at least three nodes are connected to the moveable portions of the three stages so as to be independently movable relative to the platform.

10. The device of claim 1, wherein:
    a first movable node of the plurality of nodes is coupled to and movable relative to the platform by a first movable stage, and
    a second movable node of the plurality of nodes is coupled to and movable relative to the first movable stage by a second movable stage.

11. The device of claim 1, wherein:
    a first thermal node of the plurality of nodes is configured to provide a first thermal flux at a first top surface of the first thermal node, and a second thermal node of the plurality of nodes is configured to provide a second thermal flux at a second top surface of the second thermal node.

12. The device of claim 11, wherein the first thermal flux is different from the second thermal flux.

13. The device of claim 11, wherein the first top surface has a different area than the second top surface.

14. The device of claim 1 further comprising a heat sink in contact with top surfaces of at least two nodes of the plurality of nodes.

15. The device of claim 1 further comprising a vapor chamber in contact with top surfaces of at least two nodes of the plurality of nodes.

16. A device for simulating thermal loads, the device comprising:

a platform;

a stage affixed to the platform, a portion of the stage being moveable horizontally relative to the platform; and a plurality of thermal nodes coupled with the platform, the plurality of thermal nodes configured to simulate a size or shape of a component of a chip or multi-chip module design, wherein a thermal node of the plurality of thermal nodes is affixed to the moveable portion of the stage and is configured to provide a thermal flux at a top surface of the thermal node.

17. The device of claim 16, wherein a first top surface of a first thermal node of the plurality of thermal nodes is adjacent to a second top surface of a second thermal node of the plurality of thermal nodes and the first top surface and the second top surface are configured to simulate at least a portion of a chiplet.

18. The device of claim 17, wherein a first thermal flux of the first thermal node is different from a second thermal flux of the second thermal node.

19. The device of claim 18, wherein at least two of the thermal nodes of the plurality of thermal nodes each have a top surface area of less than 4 mm2.

20. A device for simulating thermal loads, the device comprising:

a platform;

a stage including at least a first substage and a second substage, wherein the first substage is movable horizontally relative to the second substage, and the second substage is affixed to the platform;

a node of a plurality of nodes affixed to the first substage so as to be movable relative to the second substage, wherein the plurality of nodes are configured to simulate a size or shape of a component of a chip or multi-chip module design; and a thermal source connected to the node and configured to transfer thermal energy between the thermal source and a top surface of the node.

* * * * *